United States Patent
Kawano

(10) Patent No.: US 9,484,512 B2
(45) Date of Patent: Nov. 1, 2016

(54) LIGHT EMITTING DEVICE, AND SUBSTRATE FOR LIGHT EMITTING DEVICE

(71) Applicant: NICHIA CORPORATION, Anan-shi, Tokushima (JP)

(72) Inventor: Yusuke Kawano, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/863,636

(22) Filed: Sep. 24, 2015

(65) Prior Publication Data

US 2016/0093784 A1    Mar. 31, 2016

(30) Foreign Application Priority Data

Sep. 26, 2014 (JP) .................................. 2014-196657

(51) Int. Cl.
  *H01L 33/52* (2010.01)
  *H01L 33/62* (2010.01)
  *H01L 33/48* (2010.01)
  *H01L 33/60* (2010.01)

(52) U.S. Cl.
  CPC ............. *H01L 33/62* (2013.01); *H01L 33/483* (2013.01); *H01L 33/52* (2013.01); *H01L 33/60* (2013.01)

(58) Field of Classification Search
  None
  See application file for complete search history.

(56) References Cited

U.S. PATENT DOCUMENTS

| | | | |
|---|---|---|---|
| 2008/0101071 A1 | 5/2008 | Imai et al. | |
| 2011/0180817 A1* | 7/2011 | Ishizaki | F21K 9/135 257/88 |
| 2012/0080713 A1* | 4/2012 | Agatani | H01L 25/0753 257/99 |
| 2012/0126255 A1* | 5/2012 | Hussell | H01L 25/0753 257/88 |
| 2012/0205689 A1* | 8/2012 | Welch | H01L 25/0753 257/91 |
| 2012/0299022 A1* | 11/2012 | Hussell | H01L 25/0753 257/88 |
| 2013/0127329 A1* | 5/2013 | Komada | F21V 9/02 313/498 |
| 2014/0268783 A1 | 9/2014 | Agatani et al. | |
| 2015/0041835 A1 | 2/2015 | Agatani et al. | |
| 2015/0276198 A1* | 10/2015 | Hata | H01L 33/62 362/382 |

FOREIGN PATENT DOCUMENTS

| | | |
|---|---|---|
| JP | 2007-318014 A | 12/2007 |
| JP | 2008-135694 A | 6/2008 |
| JP | 2009-059883 A | 3/2009 |
| JP | 2012-079855 A | 4/2012 |
| JP | 2012-182215 A | 9/2012 |
| JP | 2012-190841 A | 10/2012 |
| JP | 2014-096501 A | 5/2014 |

* cited by examiner

*Primary Examiner* — Bilkis Jahan
(74) *Attorney, Agent, or Firm* — Global IP Counselors, LLP

(57) ABSTRACT

A light emitting device includes a substrate, conductive members, and first and second light emitting elements. The conductive members have first to fourth lands and a linking portion linking the second and third lands. An outer edge of the first land is positioned to the inside of a point at which an extension of a side facing the second land and an extension of a side facing the third land intersect. An outer edge of the fourth land is positioned to the inside of a point at which an extension of a side facing the second land and an extension of a side facing the third land intersect. The first light emitting element has electrodes connected to the first and second lands, and the second light emitting element has electrodes connected to the third and fourth lands.

14 Claims, 3 Drawing Sheets

LIGHT EMITTING DEVICE, AND SUBSTRATE FOR LIGHT EMITTING DEVICE

CROSS-REFERENCE TO RELATED APPLICATIONS

This application claims priority to Japanese Patent Application No. 2014-196657 filed on Sep. 26, 2014. The entire disclosure of Japanese Patent Application No. 2014-196657 is hereby incorporated herein by reference.

BACKGROUND

1. Field of the Invention

The present disclosure relates to a light emitting device and a substrate for a light emitting device.

2. Description of Related Art

There are conventional light emitting devices configured to emit white light by using a light emitting element that emits blue light and a phosphor substance that is excited by absorbing part of the blue light and emits light of a longer wavelength. In such light emitting devices, there is a light emitting device of a known type in which a plurality of light emitting elements mounted on a substrate and connected by wires are covered with a sealing resin that contains a phosphor (for example, JP2012-79855A).

SUMMARY

An object of the present disclosure is to provide a light emitting device with which the emission diameter reduces and the luminous flux increases.

The light emitting device of the present disclosure includes a substrate, conductive members, a first light emitting element and a second light emitting element. The conductive members are formed on a surface of the substrate, and have a first land, a second land, a third land and a fourth land, and linking portions linking the second land and the third land. The first land and the third land, and the second land and the fourth land being disposed adjacent to each other, respectively. An outer edge of the first land is positioned to the inside of a point at which a side of the first land facing the second land and a side of the first land facing the third land intersect, and an outer edge of the fourth land is positioned to the inside of a point at which a side of the fourth land facing the second land and a side of the fourth land facing the third land intersect. The light emitting device further includes a first light emitting element having a pair of electrodes connected to the first land and the second land, and a second light emitting element having a pair of electrodes connected to the third land and the fourth land.

The substrate for the light emitting device of the present disclosure includes conductive members formed on a surface of the substrate and having a first land and a second land configured to be connected to a pair of electrodes of a first light emitting element, a third land and a fourth land configured to be connected to a pair of electrodes of a second light emitting element, and a linking portion linking the second land and the third land. The first land and the third land, and the second land and the fourth land are disposed adjacent to each other, respectively. An outer edge of the first land is positioned to the inside of a point at which an extension of a side of the first land facing the second land and an extension of a side of the first land facing the third land side intersect, and an outer edge of the fourth land is positioned to the inside of a point at which an extension of a side of the fourth land facing the second land and an extension of a side of the fourth land facing the third land intersect.

According to the light emitting device of the present disclosure, it is possible to provide a light emitting device with which the emission diameter reduces and the luminous flux increases.

DETAILED DESCRIPTION OF THE INVENTION

DETAILED DESCRIPTION OF THE INVENTION

Embodiments for implementing the light emitting device of the present invention will be described below with reference to the accompanying drawings. In the following embodiments of the light emitting device that embody the technological concept of the present invention are just examples, and unless otherwise specified, the constituent parts discussed in the embodiments are not intended to limit the scope of the present invention. Further, constitutions described in the embodiments can be employed in other embodiments.

The sizes and the arrangement relationships of the members in each of drawings are occasionally shown exaggerated for ease of explanation.

Figure 1A:
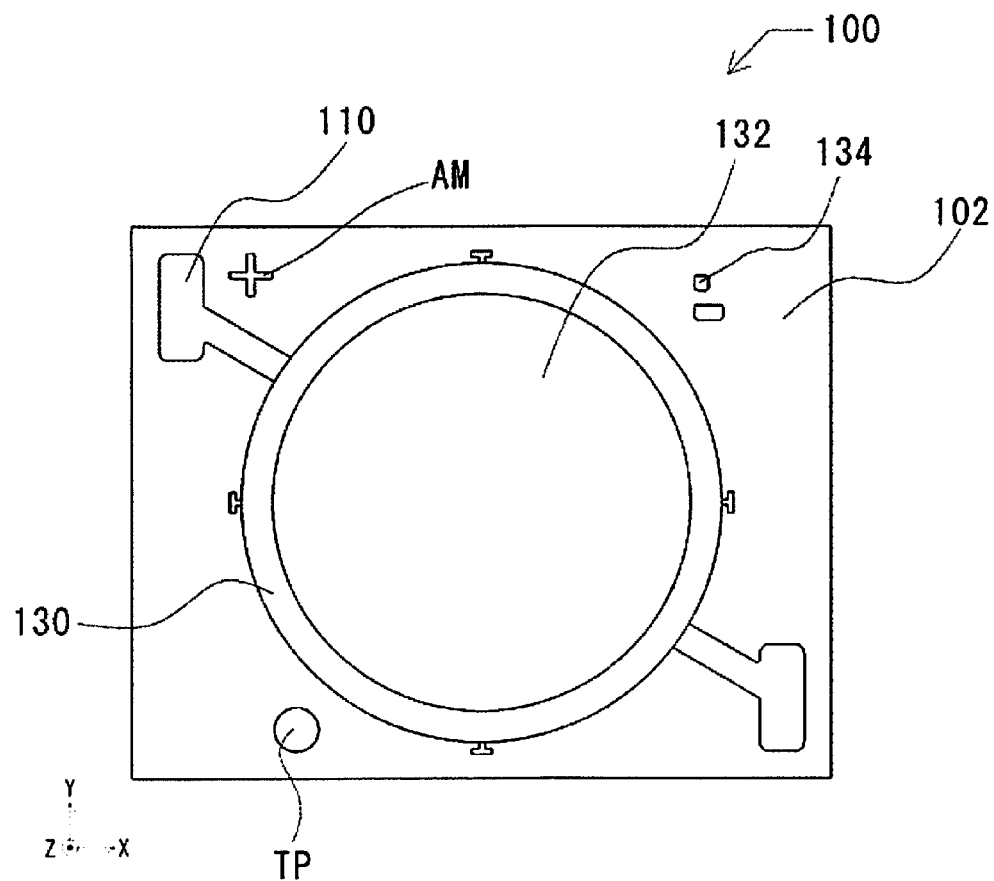
FIG. 1A is a schematic plan view.
Figure 1B:
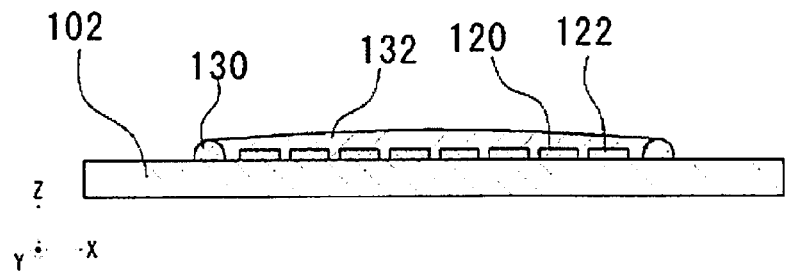
FIG. 1B is a cross-sectional view of the light emitting device according to an embodiment of the present invention.
Figure 2:
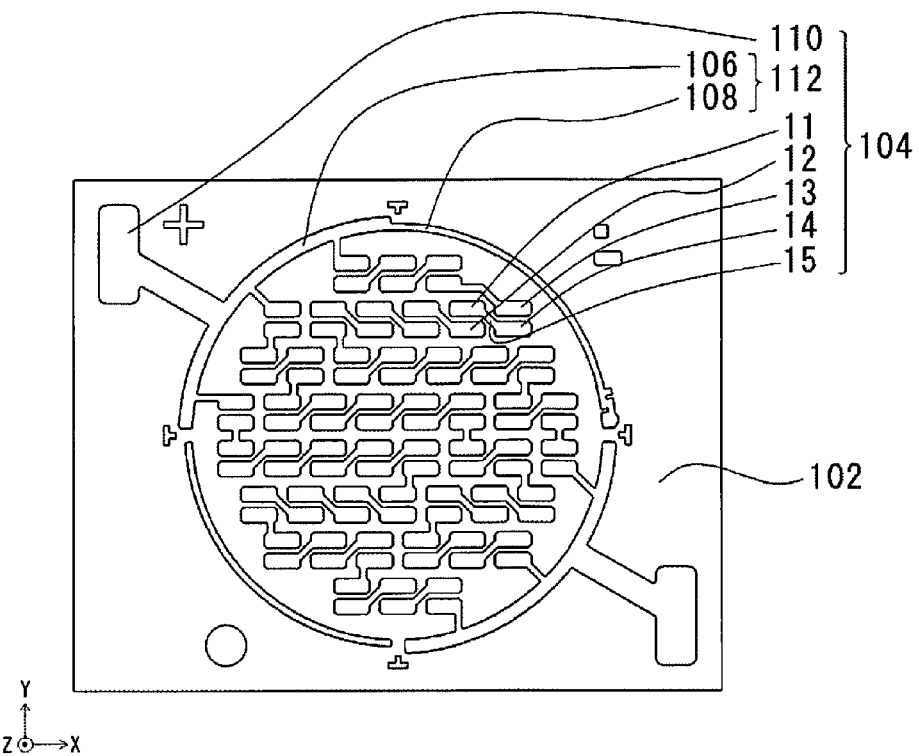
FIG. 2 is a partial plan view of the light emitting device in FIG. 1A in which the frame, the sealing member and the light emitting elements are omitted for the sake of brevity.

FIG. 1 is a schematic structural diagram illustrating an example of a light emitting device according to one embodiment. FIG. 2 does not show the frame 130, the sealing member 132 and the light emitting elements of the light emitting device in FIG. 1, in order to make the description easier to understand.

As shown in FIGS. 1 and 2, the light emitting device 100 in this embodiment includes a substrate 102, conductive members 104 disposed on the surface of the substrate 102, and first light emitting elements 120 and second light emitting elements 122 that are connected to the conductive members 104.

Figure 3:
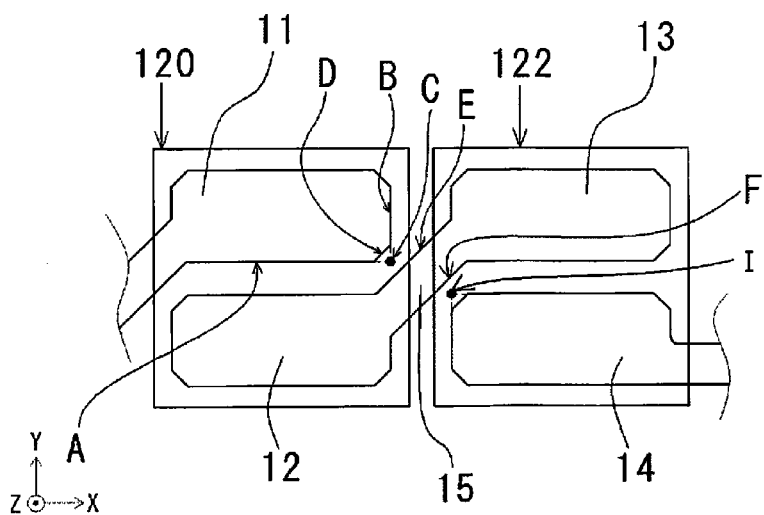
FIG. 3 is an enlarged detailed plan view of the area near the first light emitting element and the second light emitting element in an embodiment of the present invention.

FIG. 3 is a detailed view of the area near the first light emitting element 120 and the second light emitting element 122.

As shown in FIG. 2 and FIG. 3, the conductive members 104 include first lands 11 and second lands 12 corresponding to a pair of electrodes of the first light emitting elements 120, and third lands 13 and fourth lands 14 corresponding to a pair of electrodes of the second light emitting elements 122. In FIG. 3, for the first light emitting elements 120 and the second light emitting elements 122, only the outer edges of them are shown in order to make the description easier to understand, and are shown so that the shape of the lands can be seen through the light emitting elements.

To electrically connect the first light emitting elements 120 and the second light emitting elements 122, the conductive members 104 include linking portions 15 that link the second lands 12 and the third lands 13. Also, the first lands 11 and the third lands 13, and the second lands 12 and the fourth lands 14 are disposed adjacent to each other, respectively, while the first lands 11 and the fourth lands 14, and the second lands 12 and the third lands 13 are disposed opposite each other with the linking portions 15 in between.

As shown in FIG. 3, the outer edges of the first lands 11, the second lands 12, the third lands 13, and the fourth lands 14 include straight lines extending in the x and y directions. The outer edges of the linking portions 15 include sides E and F that are inclined to the x and y directions. The sides E and F are substantially parallel to each other, and link the corners of the second lands 12 and the third lands 13 at a specific width.

Furthermore, all of the outer edges of the first lands 11 are positioned to the inside of a point C at which an extension of a side A located on the second land 12 side and an extension of a side B located on the third land 13 side intersect. In this embodiment, the sides A and B are straight lines. From another viewpoint, the outer edges of the first lands 11 are made of a plurality of straight lines, and have a shape in which the corners of portions close to the linking portions 15 are chamfered. These chamfered sides D are formed at an angle to the sides A and B, and these sides D are disposed so as to be substantially parallel to the sides E and F of the linking portions close to the sides D.

Similarly, all of the outer edges of the fourth lands 14 have a side disposed to the inside of a point I at which an extension of a side located on the second land 12 side and an extension of a side located on the third land 13 side intersect.

To reduce the emission diameter and maintain a high luminous flux, it is necessary to mount in high density enough of the light emitting elements to obtain the desired luminous flux. Also, to obtain a high luminous flux, it is necessary to use a structure that allows more current to flow. Therefore, flip-chip mounting is preferable as it affords good heat dissipation and mounting at a narrow pitch.

Figure 4:
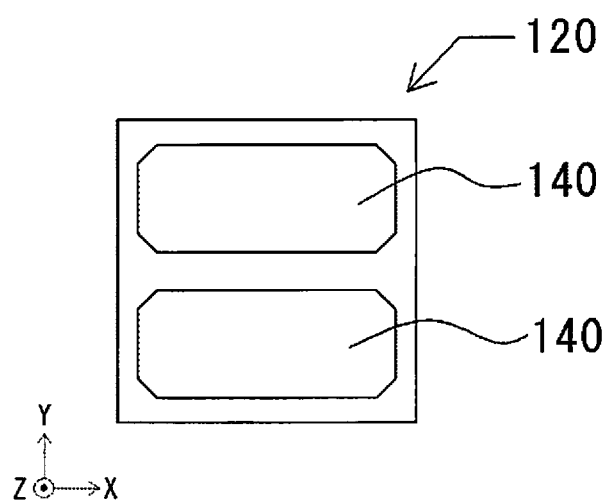
FIG. 4 is a simplified plan view of the light emitting element in an embodiment of the present invention.

In this embodiment, the positive and negative electrodes of the first light emitting elements 120, and the first lands 11 and the second lands 12 are flip-chip mounted via bonding members to establish electrical connections. It is preferable that planar shapes of the electrode pairs of the first light emitting elements 120 substantially coincide with the planar shape of the first lands 11 and the second lands 12. FIG. 4 shows a light emitting element that can be used in this embodiment. As shown in FIG. 4, the shapes of the electrode pairs of the light emitting elements are substantially the same as the shape of the lands. With this structure, when the light emitting elements are reflow mounted with solder or the like, a self-alignment effect can be used to facilitate the positioning of the electrodes and the lands. Accordingly, positioning accuracy can be improved, so that mounting the light emitting elements at a higher density is possible.

Meanwhile, since flip-chip mounting does not involve the use of wires for electrical connection between light emitting elements, in the case of flip-chip mounting, it is necessary to establish an electrical connection between light emitting elements by conductive members on the substrate side. In this embodiment, as shown in FIGS. 2 and 3, the second lands 12 and the third lands 13 are linked by the linking portions 15. In this embodiment, since the outer edges of the first lands 11 have a side D that is located to the inside of the point C at which an extension of the side A located on the second land 12 side and an extension of the side B located on the third land 13 side intersect, the lands of the first light emitting elements and the second light emitting elements can be disposed at a narrower pitch, without reducing the width of the linking portions 15. The same applies to the fourth lands 14.

If the linking portions 15 is narrow in the width, excess heat may be generated in a wiring, or a fusing disconnection may occur under drive at a high current level. Therefore, the linking portions 15 need to have a width that corresponds to the current that will be flowing. The fusing disconnection can be prevented by increasing the thickness of the linking portions 15 (the length in the z direction), but increasing the width is preferable than increasing the plating thickness. It is also possible to embed a metal member in the interior of the substrate, but this is undesirable because it adds a step of processing the substrate and also complicates the structure. In this embodiment, a single-layer substrate made of a flat insulating member can be used as the substrate 102, which can help reducing the cost of the substrate.

For example, to reduce the emission diameter and increase the luminous flux, a spacing between adjacent light emitting elements is preferably from 0.1 to 0.3 µm. It is also preferable for the spacing between adjacent first lands and third lands to be equal to or less than 400 µm.

From the standpoint of preventing fusing disconnection, for example, the width of the linking portions 15 is preferably at least one-fifth the length of one side of a mounted light emitting element.

A preferred embodiment of the light emitting device 100 pertaining to this embodiment will now be described.

Substrate 102

The substrate 102 is a member that serves as a base on which the first light emitting elements 120 and the second light emitting elements 122 are mounted. From the standpoint of reducing the cost, it is preferable that a flat substrate made of an insulating member is used for the substrate, but the substrate may also have a recess at the portion where the light emitting elements are mounted.

The material of the substrate 102 is preferably an inorganic material that will undergo little degradation, and a ceramic is particularly preferable. Examples of ceramic materials include alumina, mullite, forsterite, aluminum nitride (AlN), silicon carbide (SiC), and low temperature co-fired ceramics (LTCC). Among these, it is preferable to use aluminum nitride from the standpoint of heat dissipation, and it is also preferable to use a member whose thermal conductivity is at least 160 W/m·K.

Also, in order to raise the light reflectivity of the substrate itself, the substrate 102 may be formed from a porous material having numerous voids, by partially integrating the particles of alumina, yttria, zirconia, titania, diamond, calcium oxide, barium sulfate, or another such inorganic material. This allows for raising the light-reflectivity by using the difference in the refractive index between these materials and the air. For example, the light-reflectivity of the substrate 102 at a wavelength of 450 nm is preferably at least 80%, and more preferably at least 85%.

In addition to ceramics, a resin can be used as a material which can be applied in this embodiment. Examples of this resin material include aliphatic polyamide resins, semiaromatic polyamide resins, polyethylene terephthalate, polycyclohexane terephthalate, liquid crystal polymers, polycarbonate resins, syndiotactic polystyrene, polyphenylene ether, polyphenylene sulfide, polyether sulfone resins, polyether ketone resins, polyallylate resins, and other such thermoplastic resins, and polybismaleimide triazine resins, epoxy resins, silicone resins, modified silicone resins, modified epoxy resins, polyimide resins, polyurethane resins, phenol resins, and other such thermosetting resins.

In this embodiment, an example is described in which the substrate 102 is rectangular in plan view as above, but this is not the only option, and it may instead be square or polyhedral. For example, it may have outside dimensions of 24×19 mm and a thickness of 1 mm.

Conductive Members 104

The conductive members 104 are formed on the surface of the substrate 102. The conductive members 104 are conductive members that are to be used to supply electrical power to the light emitting elements.

As shown in FIG. 2, the conductive members 104 have the first lands 11, the second lands 12, the third lands 13, the fourth lands 14, and the linking portions 15, which are to be directly bonded with the electrodes of the light emitting elements via bonding members. They also have a pad 110 for applying an external power supply to the end of the substrate. This pad 110 may be connected to a connector, and the external power supply may be supplied via this connector. Further, there may be wiring 112 that links the pad 110 to the various lands.

Since the conductive members 104 absorb light, they are preferably formed as small as possible while still ensuring the required size. Therefore, those portions of the wiring 112 where the current volume is allowed to be low are preferably formed in a narrower width than the other portions. More specifically, as shown in FIG. 2, the wiring 112 is formed so as to have a wide part 106 and a narrow part 108 that is narrower than the wide part. This allows for reducing the absorption of light by the wiring. The wide part 106 is disposed closer to the pad 110 than the narrow part 108.

In the case where a ceramic is used as the substrate 102, the conductive members 104 are formed as a metal layer. For example, the conductive members 104 may be formed by forming a metallized layer made of a high-melting point metal on the surface of the substrate 102 and baking the whole thing by co-firing, or may be formed by a post-firing method in which the sintered substrate 102 is coated with any of various kinds of paste or stacked with a metal film by sputtering. After the metal layer has been formed on the surface of the substrate, a pattern may be formed by etching, using a dry film resist, etc.

The material of the conductive members 104 formed on the ceramic is formed by disposing on the substrate a metal or alloy layer whose main component is tungsten, molybdenum, titanium, nickel, gold, copper, silver, palladium, rhodium, platinum, tin, or the like. More specifically, it can be formed by vapor deposition, sputtering, printing, or another such method, and can be further formed by plating, etc., over this. From the standpoints of adhesion to the bonding members and reducing degradation, it is preferable to use a metal layer whose main component is gold as the outermost surface of the conductive members 104.

Further, copper, whose thermal conductivity is high, may be formed thicker than the other metals in order to improve heat dissipation. For instance, it is preferable to form a layer that contains copper in a thickness of at least 25 μm.

Also, in the case where a resin is used as the material of the substrate 102, a prepreg of semi-cured resin can be clad with a metal sheet and heat cured, and then the metal sheet can be patterned in the desired shape by photolithography or the like to form the conductive members. Also in this case, the surface may be further plated.

In the formation of the conductive members, a positioning mark, a mark indicating polarity, or a pattern used for temperature measurement may be formed at the same time. In this embodiment, as shown in FIG. 1, an anode mark AM, a temperature measurement mark TP, and a positioning mark 134 are formed.

Light Emitting Elements

The light emitting elements (the first light emitting elements 120 and the second light emitting elements 122) are disposed on the substrate 102. The light emitting elements are bonded to the substrate 102 via bonding members to be electrically connected to the conductive members 104. LED elements or other such semiconductor light emitting elements can be used, for example, as the light emitting elements here. The light emitting elements usually include a light-transmissive substrate, a semiconductor layer stacked over the light-transmissive substrate, and a pair of positive and negative electrodes disposed on the semiconductor layer.

The positive and negative electrodes are formed on the surface of the semiconductor layer (in the case where the light-transmissive substrate is present, on the opposite side from the light-transmissive substrate). This allows flip-chip mounting to be performed in which the substrate 102 and the light emitting element are bonded so that the positive and negative lands of the substrate 102 faces the positive and negative electrodes of the light emitting elements. As shown in FIG. 4, in this embodiment positive and negative electrodes 140 having substantially the same shape are provided on the same surface of the light emitting elements 120. The shape of the electrodes 140 substantially coincides with the shape of the first lands 11 and the second lands 12.

The positive and negative electrodes of the light emitting elements can be made, for example, of single-layer films or laminated films of Au, Pt, Pd, Rh, Ni, W, Mo, Cr, Ti or the like or alloys of these. More specifically, an example is a laminated film in which Ti/Rh/Au, W/Pt/Au, Rh/Pt/Au, W/Pt/Au, Ni/Pt/Au, Ti/Rh or the like have been laminated in that order starting from the semiconductor layer side. The film thickness may be the thickness of any film used in this field.

A reinforcing layer may be disposed on the side of a nitride semiconductor laminate on which the positive and negative electrodes are disposed. The term reinforcing layer here refers to a layer that increases the strength of the nitride semiconductor laminate, and may be formed from either an insulating material, a semiconductor, or a conductive material. The entire reinforcing layer may be a single layer or a laminated layer, or may be single layers, laminated layers, or the like disposed at a plurality of locations. A portion of the reinforcing layer is also used to ensure the insulation, conductivity, or the like that is essential to the function of the light emitting elements. In particular, a portion of the films used to constitute the light emitting elements may be formed thicker. More specifically, a conductive layer that functions as an electrode or the like may be formed thicker by plating, sputtering, or some other known method. The inter-layer insulation films, surface protection films, and the like disposed in between these may also be formed thicker. This allows for ensuring the proper amount of strength while preventing the light emitting device from becoming larger because no additional layers are used.

The light emitting elements may emit ultraviolet light or visible light. In the case of using in a light emitting device that emits white light, the light emitting elements are preferably blue light emitting elements with an emission wavelength of at least 400 nm and no more than 530 nm, and more preferably at least 420 nm and no more than 490 nm. Using blue light emitting elements in combination with a yellow phosphor as the wavelength conversion member (discussed below) allows a white light emitting device to be obtained. It is particularly preferable for the blue light emitting elements to be based on a nitride semiconductor ($In_XAl_YGa_{1-X-Y}N$, $0 \leq X$, $0 \leq Y$, $X+Y \leq 1$) with which efficient excitation of the phosphor is possible. Two or more light emitting elements are mounted in a single light emitting device 100. Protective elements or the like may also be provided in addition to the light emitting elements. These protective elements may be connected by wires, or may be flip-chip mounted.

Bonding Members

The bonding members are used to fix the light emitting elements to the conductive members 104 of the substrate 102. In this case, the positive and negative electrodes of the light emitting elements are usually bonded to the above-mentioned lands by these bonding members. These bonding members can be made from any material known in this field, and an example is a conductive bonding member. Examples of the bonding member include solders such as tin-bismuth-based solder, tin-copper-based solder, tin-silver-based solder, gold-tin-based solder and the like (specifically, alloys of Ag, Cu and Sn; Cu and Sn, and Bi and Sn as main components); eutectic alloys such as alloys of Au and Sn, Au and Si, Au and Ge, Au and Cu, Ag and Cu as main components; conductive pastes of silver, gold, palladium and the like; bumps; anisotropic conductive materials; low-melting-point metals and the like. Among these, using solder allows to obtain high-accuracy self-alignment in cooperation with the shape of the lands as described above. Therefore, this makes it easier to mount the light emitting elements in the right places, improves mass production, and allows a more compact light emitting device to be manufactured.

White Resist

Figure 5:
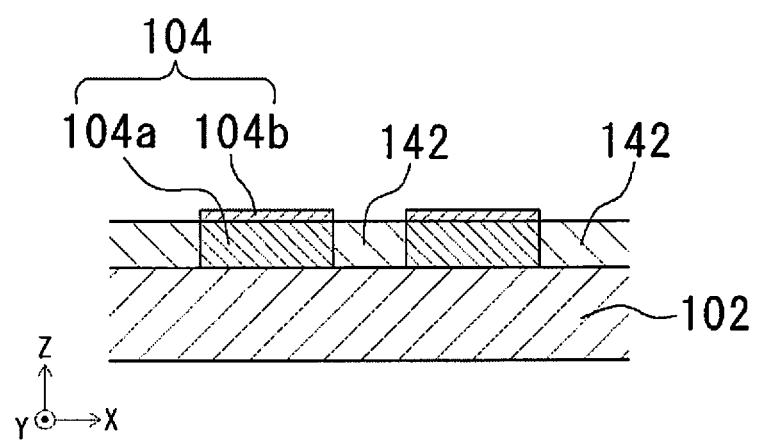
FIG. 5 is a partial enlarged cross-sectional view of the substrate on which the light emitting element shown in FIG. 1 is mounted.

In the case where the substrate 102 is a member that absorbs or transmits light, the surface of the substrate is preferably covered with a covering layer made of a light reflective material such as a white resist. FIG. 5 is a cross-sectional view of the substrate 102 on which the light emitting elements shown in FIG. 1 have been mounted. In this embodiment, the white resist is formed on the surface of the substrate 102 so as to cover the side surfaces of the conductive members 104a. This white resist is formed, for example, by forming a white resist layer on the substrate 102 where the conductive members 104a are arranged so as to cover the conductive members 104a, and then polishing the white resist layer until the surface of the conductive members 104a is exposed. This allows to obtain a substrate in which the upper surface of the white resist 142 and the upper surfaces of the conductive members 104 are substantially in the same surface, and the gaps between the conductive members are filled in by the white resist 142. Furthermore, the surface of the conductive members 104a can be plated to make the upper surfaces of the conductive members higher than the surface of the white resist 142. Mounting of the light emitting elements will be easier in the case where the upper surfaces of the lands are located higher than the white resist 142. A thickness of this plating layer 104b is about 0.2 to 10 µm, for example, and preferably 1 to 5 µm.

An example of the material used for the white resist or white resin is $TiO_2$ or other such light-reflective particles that have been mixed into an organic or inorganic binder. A so-called white resist, white resin, white ink, ceramic ink, or the like is applicable. It is particularly preferable for the organic binder to be a silicone resin, which has excellent resistance to heat and light. This allows a light to be reflected by the substrate surface, so that a light emitting device with high light extraction efficiency can be obtained.

The light-reflective particle contained in the white resist can be such a light-reflective material that is less likely to absorb light from the light emitting elements and has a large difference in refractive index from that of the resin which is to be a base material of the white resist. Examples of the light-reflective particle include an inorganic material such as $TiO_2$, $SiO_2$, $Al_2O_3$, $ZrO_2$, $K_4O_4Ti$, $Al(OH)_3$, MgO. Dispersing such light-reflective particle in the base material allows reflecting light more efficiently.

The thickness of the white resist is 20 to 60 µm, for example, and preferably 30 to 40 µm. The white resist may be formed by a laminated layer having two or more layers.

The white resist can be formed on the substrate as follows, for example. First, a seed layer made of titanium, nickel, or the like is formed by sputtering on the surface of a substrate of AlN or the like, after which a resist is disposed on the seed layer, and an unnecessary portions of the seed layer are covered by the resist to produce the desired shape by photolithography. From over the resist, a metal layer made of a material with good heat dissipation (such as copper) in a thickness of about 30 to 40 µm is disposed by using electroplating, after which the resist is peeled off, then the unnecessary portion of the seed layer is etched, and the white resist is printed so as to cover these metal layers.

After this, the surface of the white resist is polished to expose the metal layers. A layer of Ni/Pd/Au is then formed by electroless plating. This allows the upper surfaces of the lands to be higher than the white resist. The conductive parts (the seed layer, the metal layer, and the plating layer) formed in such a process is to be the conductive members 104.

In the case where the white resist outgases siloxane or other such gases under heating, it is preferable to bake it after surface polishing to reduce the generation of out-gases in subsequent steps.

Frame

As shown in FIG. 1, the frame 130 is formed in the shape of a frame that surrounds the light emitting elements on the substrate 102. A region surrounded by this frame is filled in with a sealing member, thus covers the light emitting elements with the sealing member.

The frame preferably reflects light. It is preferable, for example, to use a frame in which a light reflecting member is contained in an insulating resin. Also, for example, a thermosetting resin, a thermoplastic resin, or the like can be used to ensure a certain amount of strength. More specifically, examples include phenol resins, epoxy resins, BT resins, PPA, and silicone resins. In the case where a protective element or other such non-light emitting device is mounted on a substrate, it may causes of light absorption, so it is preferably embedded in a frame that reflects light. This frame can be formed by using a method in which a resin is discharged from a dispenser while being drawn in a pattern, or by resin printing, transfer molding, compression molding, or the like.

When the optical reflectivity of the frame is higher than the optical reflectivity of the wiring, the frame is preferably formed so as to cover the wiring.

Sealing Member 132

The sealing member 132 is preferably made of a material that is electrically insulating, is able to transmit light emitted from the light emitting elements, and has fluidity before solidifying. The optical transmissivity of the sealing member is preferably at least 70%. Examples of such material include a resin such as a silicone resin, a modified silicone resin, an epoxy resin, a modified epoxy resin, phenolic resin, polycarbonate resin, acrylic resin, polymethylpentene resin, polynorbornene resin, or hybrid resin containing one or more of these resins. Among these, silicone resins are preferable because of their excellent resistance to heat and light and their small volumetric shrinkage after solidification.

Wavelength Conversion Member

The sealing member 132 may include a wavelength conversion member that is excited by at least a part of the light emitted by the light emitting elements, and emits light of a wavelength that is different from the emission wavelength of the light emitting elements.

Typical examples of wavelength conversion members are phosphors and quantum dots.

Phosphor

The phosphor used as a wavelength conversion member may be a single type of phosphor, or two or more types of phosphor. Any phosphor known as one that is used for LEDs may be used. For example, two kinds of phosphor may be used, namely, a first phosphor and a second phosphor having different particle sizes and/or emission colors. Thus using a plurality of types of phosphors with different emission colors can improve color reproducibility and color rendering.

Examples of the phosphor include yttrium-aluminum-garnet (YAG)-based phosphors, lutetium-aluminum-garnet (LAG)-based phosphors for emitting yellow to green light, chloro-silicate-based phosphors, β-sialon phosphors for emitting green light, SCASN-based phosphors such as $(Sr, Ca)AlSiN_3$:Eu, CASN-based phosphors such as $CaAlSiN_3$:Eu, $SrAlSiN_3$:Eu phosphors, KSF-based phosphers such as $K_2SiF_6$:Mn for emitting red light.

The particle size of the phosphor is preferably about 2 to 50 μm, and more preferably about 5 to 20 μm. The larger is the particle size of the phosphor, the higher will the light extraction efficiency of the light emitting device tend to be, but the greater will color unevenness tend to be.

In addition to the above-mentioned wavelength conversion member, the sealing member 132 may also include a filler, a diffusion material, or other such additives. Examples of the diffusion material include $SiO_2$, $TiO_2$.

The light emitting device and the substrate of the present embodiment is devised in light of the disadvantageous feature of the conventional light emitting device such as the emission diameter is large, it may be difficult to apply the device to illumination in applications involving narrow-angle light distribution, such as in projectors and the like, and in the case where the emission diameter is reduced, the number of light emitting elements may be reduced so that the required luminous intensity and luminous flux will not be attained.

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a substrate;
   a plurality of conductive members formed on a surface of the substrate, and the conductive members including
      a first land,
      a second land,
      a third land,
      a fourth land, and
      a linking portion linking the second land and the third land,
      the first land and the third land being disposed adjacent to each other, and the second land and the fourth land being disposed adjacent to each other,
      an outer edge of the first land being positioned to the inside of a point at which an extension of a side of the first land facing the second land and an extension of a side of the first land facing the third land intersect, and
      an outer edge of the fourth land being positioned to the inside of a point at which an extension of a side of the fourth land facing the second land and an extension of a side of the fourth land facing the third land intersect;
   a first light emitting element having a pair of electrodes connected to the first land and the second land of the conductive members; and
   a second light emitting element have a pair of electrodes connected to the third land and the fourth land of the conductive members.

2. The light emitting device according to claim 1, wherein the outer edge of the first land or the fourth land has a side substantially parallel to an outer edge of the linking portion.

3. The light emitting device according to claim 1, wherein planar shapes of the electrodes of the first light emitting element substantially coincide with planar shapes of the first land and the second land, respectively.

4. The light emitting device according to claim 1, wherein a spacing between the first land and the third land is equal to or less than 400 μm.

5. The light emitting device according to claim 1, wherein a width of the linking portion is at least one-fifth a length of one side of each of the first light emitting element and the second light emitting element.

6. The light emitting device according to claim 1, further comprising
   a light-reflective frame formed on the substrate, and surrounding a region of the substrate on which the first light emitting element and the second light emitting element are mounted, and
   a sealing member that is filled inside of the region surrounded by the light-reflective frame.

7. The light emitting device according to claim 6, wherein the conductive members include a pad portion and a wiring portion that links the pad portion to the first land or the second land, and
the light-reflective frame is formed so as to cover the wiring portion.

8. The light emitting device according to claim 7, wherein the wiring portion has a wide part and a narrow part that is narrower than the wide part, and the wide part is disposed closer to the pad portion side than the narrow part.

9. The light emitting device according to claim 1, further comprising
a plurality of additional first light emitting elements, and
a plurality of additional second light emitting elements, wherein
the conductive members further include a plurality of additional pairs of the first land and the second land configured to be respectively connected to a plurality of pairs of electrodes of the additional first light emitting elements, and
the conductive members further include a plurality of additional pairs of the third land and the fourth land configured to be respectively connected to a plurality of pairs of electrodes of the additional second light emitting elements.

10. The light emitting device according to claim 1, wherein
the first land has a shape in which a corner of the first land adjacent to the linking portion is chamfered, and
the fourth land has a shape in which a corner of the fourth land adjacent to the linking portion is chamfered.

11. A substrate for a light emitting device comprising:
a plurality of conductive members formed on a surface of the substrate and including
a first land and a second land configured to be connected to a pair of electrodes of a first light emitting element,
a third land and a fourth land configured to be connected to a pair of electrodes of a second light emitting element, and
a linking portion linking the second land and the third land,
the first land and the third land being disposed adjacent to each other, and the second lands and the fourth lands being disposed adjacent to each other,
an outer edge of the first land being positioned to the inside of a point at which an extension of a side of the first land facing the second land and an extension of a side of the first land facing the third land intersect, and
an outer edge of the fourth land being positioned to the inside of a point at which an extension of a side of the fourth land facing the second land and an extension of a side of the fourth land facing the third land intersect.

12. The substrate according to claim 11, wherein
the conductive members further include a plurality of additional pairs of the first land and the second land configured to be respectively connected to a plurality of pairs of electrodes of a plurality of additional first light emitting elements, and
the conductive members further include a plurality of additional pairs of the third land and the fourth land configured to be respectively connected to a plurality of pairs of electrodes of a plurality of additional second light emitting elements.

13. The light emitting device according to claim 11, wherein
the first land has a shape in which a corner of the first land adjacent to the linking portion is chamfered, and
the fourth land has a shape in which a corner of the fourth land adjacent to the linking portion is chamfered.

14. The substrate according to claim 11, further comprising
a covering layer covering the surface of the substrate between the conductive members, an upper surface of the conductive members being disposed higher than an upper surface of the covering layer.

* * * * *